US009846500B2

(12) United States Patent
Lee et al.

(10) Patent No.: US 9,846,500 B2
(45) Date of Patent: Dec. 19, 2017

(54) ORGANIC ELECTROLUMINESCENT TOUCH PANEL WITH ANTI-INTERFERENCE STRUCTURES

(71) Applicants: HannStar Display (Nanjing) Corporation, Nanjing (CN); HANNSTAR DISPLAY CORPORATION, Taipei (TW)

(72) Inventors: Hsing-Ying Lee, Taipei (TW); Da-Ching Tang, Taipei (TW)

(73) Assignees: Hannstar Display (Nanjing) Corporation, Nanjing (CN); Hannstar Display Corporation, Taipei (TW)

( * ) Notice: Subject to any disclaimer, the term of this patent is extended or adjusted under 35 U.S.C. 154(b) by 193 days.

(21) Appl. No.: 14/803,760

(22) Filed: Jul. 20, 2015

(65) Prior Publication Data

US 2016/0034061 A1    Feb. 4, 2016

(30) Foreign Application Priority Data

Jul. 29, 2014  (CN) .......................... 2014 1 0365825
Jul. 29, 2014  (CN) .......................... 2014 1 0366449

(51) Int. Cl.
  *G06F 3/041*   (2006.01)
  *H01L 27/32*   (2006.01)
  (Continued)

(52) U.S. Cl.
  CPC ............. *G06F 3/0412* (2013.01); *H01B 1/08* (2013.01); *H01L 27/323* (2013.01);
  (Continued)

(58) Field of Classification Search
  CPC ......... G06F 3/0412; G06F 2203/04103; G06F 2203/04112
  See application file for complete search history.

(56) References Cited

U.S. PATENT DOCUMENTS

2006/0244698 A1* 11/2006 Koshimizu .......... G09G 3/3637
                                                        345/80
2007/0008262 A1*  1/2007 Harada .................... G09G 3/36
                                                        345/87

(Continued)

FOREIGN PATENT DOCUMENTS

CN      101488066      7/2009
CN      101989016      3/2011
(Continued)

*Primary Examiner* — Lisa Landis
(74) *Attorney, Agent, or Firm* — Muncy, Geissler, Olds & Lowe, P.C.

(57) ABSTRACT

An organic electroluminescent touch panel includes a protection unit, a plurality of touch-sensing units, at least one first anti-interference spot, a substrate, a first electrode layer, an organic layer stack and a second electrode layer. The touch-sensing units are coplanarly disposed on the protection unit. A first interval region is formed between the adjacent touch-sensing units. The first anti-interference spot is disposed within the first interval region. The substrate is disposed corresponding to the protection unit. The first electrode layer is disposed on the substrate, the organic layer stack is disposed on the first electrode layer, and the second electrode layer is disposed on the organic layer stack. The first electrode layer, the organic layer stack and the second electrode layer are disposed within the space formed by the protection unit and the substrate.

19 Claims, 8 Drawing Sheets

(51) Int. Cl.
*H01B 1/08* (2006.01)
*H01L 51/00* (2006.01)

(52) U.S. Cl.
CPC .............. *G06F 2203/04103* (2013.01); *G06F 2203/04112* (2013.01); *H01L 51/0097* (2013.01); *H01L 2251/5338* (2013.01)

(56) References Cited

U.S. PATENT DOCUMENTS

| | | | |
|---|---|---|---|
| 2010/0152794 A1* | 6/2010 | Radivojevic | A61N 1/0452 607/2 |
| 2011/0261003 A1* | 10/2011 | Lee | G02F 1/13338 345/174 |
| 2014/0204048 A1 | 7/2014 | Lai et al. | |
| 2014/0320760 A1* | 10/2014 | Ishizaki | G06F 3/044 349/12 |
| 2015/0047885 A1* | 2/2015 | Chang | G06F 3/044 174/257 |
| 2015/0237720 A1* | 8/2015 | Van Ostrand | G06F 3/044 174/257 |

FOREIGN PATENT DOCUMENTS

| | | |
|---|---|---|
| CN | 102445805 | 5/2012 |
| CN | 103135821 | 6/2013 |
| CN | 103246409 | 8/2013 |
| CN | 103293785 A | 9/2013 |
| CN | 103702518 | 4/2014 |
| CN | 103713785 A | 4/2014 |
| CN | 103941900 | 7/2014 |

\* cited by examiner

ORGANIC ELECTROLUMINESCENT TOUCH PANEL WITH ANTI-INTERFERENCE STRUCTURES

CROSS REFERENCE TO RELATED APPLICATIONS

This Non-provisional application claims priority under 35 U.S.C. §119(a) on Patent Application No(s). 201410366449.X and 201410365825.3 filed in People's Republic of China on Jul. 29, 2014, the entire contents of which are hereby incorporated by reference.

BACKGROUND OF THE INVENTION

Field of Invention

This invention relates to a touch panel and, in particular, to an organic electroluminescent touch panel.

Related Art

Recently, the touch technology has been widely applied to common consumer electronic products, such as organic electroluminescent display panels. The touch technology can be applied to the display panel in multiple types. For example, a touch panel is attached to the display panel, i.e. the out-cell type, or the touch-sensing units are directly formed on the display panel, which is the embedded type and can be divided into on-cell type and in-cell type. However, the conventional touch-sensing structures suffer the problem of a decreasing product yield.

A conventional touch-sensing structure includes a substrate and a plurality of touch-sensing units. The touch-sensing units are disposed on the substrate and used to sense the user's touch to generate electric signals. After processing the electric signals, the touch coordinates of the user can be obtained. However, because of the interval just of 10 μm~30 μm between the touch-sensing units, the adjacent touch-sensing units will be easily short-circuited when particles fall down or scratches happen during the process, or touch-sensing units are bent. As a result, the malfunction of the touch product may happen and the product yield will be decreased. Besides, the requirements of the flexible and wearable electronic products can't be satisfied.

Therefore, it is important to provide an organic electroluminescent touch panel whereby the above-mentioned short circuit problems can be solved and the touch function, product yield and flexibility can be enhanced.

SUMMARY OF THE INVENTION

An aspect of the invention is to provide an organic electroluminescent touch panel whereby the above-mentioned short circuit problems can be solved and the touch function, product yield and flexibility can be enhanced.

Therefore, an organic electroluminescent touch panel of the invention includes a protection unit, a plurality of touch-sensing units, at least one first anti-interference spot, a substrate, a first electrode layer, an organic layer stack and a second electrode layer. The touch-sensing units are coplanarly disposed on the protection unit. A first interval region is formed between the adjacent touch-sensing units. The first anti-interference spot is disposed within the first interval region. The substrate is disposed corresponding to the protection unit. The first electrode layer is disposed on the substrate, the organic layer stack is disposed on the first electrode layer, and the second electrode layer is disposed on the organic layer stack. The first electrode layer, the organic layer stack and the second electrode layer are disposed within the space formed by the protection unit and the substrate.

Moreover, an organic electroluminescent touch panel of the invention includes a protection unit, a substrate, a first electrode layer, an organic layer stack, a second electrode layer, a plurality of touch-sensing units and at least one first anti-interference spot. The substrate comprises a first surface and a second surface disposed opposite the first surface. The first surface of the substrate is disposed corresponding to the protection unit. The first electrode layer is disposed on the first surface. The organic layer stack is disposed on the first electrode layer. The second electrode layer is disposed on the organic layer stack. The first electrode layer, the organic layer stack and the second electrode layer are disposed in the space formed by the protection unit and the substrate. The touch-sensing units coplanarly are disposed on the second surface of the substrate. A first interval region is formed between the adjacent touch-sensing units. The first anti-interference spot is disposed in the first interval region.

In one embodiment, the first anti-interference spot exhibits a zigzag pattern.

In one embodiment, the organic electroluminescent touch panel further comprises a grounding unit and at least one second anti-interference spot. The grounding unit is disposed coplanarly with the touch-sensing units. The grounding unit and the adjacent touch sensing unit have a second interval region therebetween. The second anti-interference spot is disposed in the second interval region.

In one embodiment, by the first anti-interference spot disposed within the first interval region formed by the adjacent touch-sensing units, the interval between the adjacent touch sensing units is enlarged, the short circuit is prevented even if the particle pollution is caused during the subsequent process, so as to provide the electrical anti-interference effect.

In one embodiment, the subsequent process at least comprises a mechanical thinning process, a chemical thinning process, a chemical-mechanical thinning process, a photolithography process, a thin film deposition process and/or a thin film etching process.

In one embodiment, the substrate is a flexible substrate or a rigid substrate.

In one embodiment, the organic electroluminescent touch panel further comprises a light absorbing layer disposed between the organic layer stack and the first electrode layer.

In one embodiment, the protection unit at least comprises a cover plate, a single layer membrane, a multilayer membrane or a combination thereof.

In one embodiment, the organic layer stack at least comprises a hole injection layer, a hole transporting layer, a light emitting layer, an electron transporting layer, an electron injection layer or a combination thereof.

In one embodiment, the second electrode layer is a nanometal electrode layer.

In one embodiment, the nanometal electrode layer, the first anti-interference spot and/or the touch-sensing unit are made of the composite material formed by adding conducting nanoparticles into metal nanowires.

In one embodiment, the material of the conducting nanoparticles at least comprises ITO, IGZO (indium gallium zinc oxide), IZO (indium zinc oxide), AZO (aluminum doped zinc oxide), GZO (gallium doped zinc oxide), CNT (carbon nanotube), silver nanowires or graphene In one embodiment, the nanometal electrode layer is formed by printing, inkjet printing, screen printing, coating, laser or photolithography process.

In one embodiment, the organic electroluminescent touch panel further comprises a surface modification layer disposed between the second electrode layer and the organic layer stack.

In one embodiment, the surface modification layer provides the effect of surface modification and/or planarization.

In one embodiment, the protection unit is a cover glass.

In one embodiment, the width of the first anti-interference spot is between 50 µm and 70 µm, and the width of the first interval region is between 70 µm and 130 µm.

In one embodiment, light absorbing layer is an organic material layer doped with metal material.

In one embodiment, the shapes of the touch-sensing unit and/or the first anti-interference spot are a curved shape, a triangle, a quadrangle, a polygon or a combination thereof.

As mentioned above, in the organic electroluminescent touch panel of this invention, the first anti-interference spot is disposed in the first interval region formed by the adjacent touch-sensing units, and the interval between the touch-sensing units is enlarged thereby, for example, to 70 µm~130 µm from the original 10 µm~30 µm. Hence, even if the particles fall down or the scratch occurs during the process, the adjacent touch-sensing units won't be short-circuited. Therefore, the first anti-interference spots provide the electrical anti-interference effect, so as to prevent the malfunction of the touch product and enhance the product yield and flexibility.

Furthermore, the enlarged spacing between the touch-sensing units may make the human eyes perceive the existence of the touch-sensing units, but because the first anti-interference spot with a zigzag pattern is disposed between the adjacent touch-sensing units, the touch-sensing units will become invisible and the human eyes will not easily perceive their existence, so as to provide the optical anti-interference effect and enhance the display performance.

In addition, some kind of the flexible transparent conductor that can be processed in the thermal and chemical well condition and under a non-vacuum environment is urgently demanded to effectively replace the ITO thin film sputtering process, so as to lower down the production cost and benefit the application of the rising flexible electronic industry. This invention can achieve the above-mentioned purpose by using the composite material that is formed by adding conducting nanoparticles into metal nanowires to form the nanometal electrode layer, the first anti-interference spot and/or the touch-sensing unit.

Moreover, this invention uses the nanometal electrode layer to replace the original ITO. In comparison with the vacuum coating process of ITO, the wet process of the nanometal electrode layer can greatly reduce the cost and enhance the production efficiency, and the nanometal electrode layer has a better conductivity than ITO. Therefore, the light emitting efficiency of the organic layer stack can be increased.

Moreover, by using the nanomaterial, this invention has advantages such as low wire junction resistance, smooth surface, well mechanical connection and flexibility, high transmittance and low sheet resistance. Besides, the addition of the conducting nanoparticles can help the enhancement of the optical coupling efficiency and the increment of the optical scattering level, so as to increase the viewing angle of the display panel and enhance the display performance.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
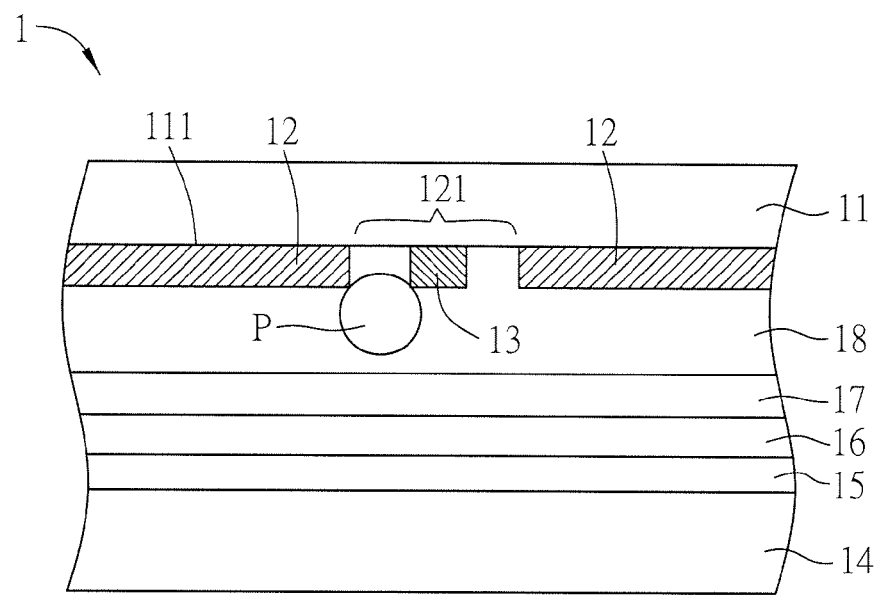
FIG. 1 is a schematic diagram of an organic electroluminescent touch panel of the first embodiment of the invention.

FIG. 1 is a schematic diagram of an organic electroluminescent touch panel 1 of the first embodiment of the invention. As shown in FIG. 1, the organic electroluminescent touch panel 1 includes a protection unit 11, a plurality of touch-sensing units 12, at least one first anti-interference spot 13, a substrate 14, a first electrode layer 15, an organic layer stack 16 and a second electrode layer 17.

The protection unit 11 includes at least, for example, a cover plate, a single layer membrane, a multilayer membrane or a combination thereof. Herein, the protection unit 11 can be a cover glass, so as to decrease the thickness of the organic electroluminescent touch panel 1.

The touch-sensing units 12 are coplanarly disposed on the protection unit 11. This embodiment is described by taking the example of the touch-sensing unit 12 disposed on the side of the protection unit 11 closer to the substrate 14, the touch-sensing units 12 are coplanarly disposed on a surface 111 of the protection unit 11. A first interval region 121 is formed between the adjacent touch-sensing units 12. The touch-sensing units 12 can be made of transparent conducting material, such as indium tin oxide (ITO) or other metal oxides. The adjacent touch-sensing units 12 shown in FIG. 1 are electrically insulated from each other for example.

The first anti-interference spot 13 is disposed within the first interval region 121. In practice, the first anti-interference spot 13 and the touch-sensing units 12 can be formed in the same processing step and made of the same material to reduce the processing steps. However, this invention is not limited thereto. Herein, the first anti-interference spot 13 is made of conducting material and is electrically floating, and a distance exists between the first anti-interference spot 13 and the adjacent touch-sensing unit 12. By disposing the first anti-interference spot 13 within the first interval region 121, the interval between the adjacent touch-sensing units 12 (first interval region 121) can be enlarged. Therefore, even if the particles P fall down or the scratch occurs, the adjacent touch-sensing units 12 won't be short-circuited, so as to prevent the malfunction of the touch product and enhance the product yield. The above-mentioned particles p come from, for example, the subsequent process which can at least include a mechanical thinning process, a chemical thinning process, a chemical-mechanical thinning process, a photolithography process, a thin film deposition process and/or a thin film etching process. By disposing the first anti-interference spot 13 within the first interval region 121 formed by the adjacent touch-sensing units 12, the interval between the adjacent touch-sensing units 12 can be enlarged. Thereby, the short circuit won't be caused even if the particle pollution of the subsequent process occurs, so as to provide the electrical anti-interference effect.

Besides, the enlarged spacing between the adjacent touch-sensing units 12 may make the human eyes perceive the existence of the touch-sensing units 12, but because the first anti-interference spot 13 is disposed between the adjacent touch-sensing units 12, the human eyes will not easily perceive the existence of the touch-sensing units 12 and therefore the display performance will not be degraded. For example, the width of the first anti-interference spot 13 is between 50 μm and 70 μm, and the width of the first interval region 121 is between 70 μm and 130 μm. In one embodiment, the material of the first anti-interference spot 13 can include metal oxide. Moreover, the first anti-interference spots 13 can include a massive spot or a bent spot. The first anti-interference spot 13 can exhibit a bent pattern.

The substrate 14 is disposed corresponding to the protection unit 11. Herein, the substrate 14 and the protection unit 11 are disposed correspondingly to form a space. The substrate 14 can be a rigid substrate or a flexible substrate, and can be applied to the flexible display when being a flexible substrate. The substrate 11 is, for example, a glass substrate, a plastic substrate, a ceramic substrate, a sapphire substrate or another type of substrate, and herein the glass substrate is applied as an example. In one embodiment, a polyethylene terephthalate (PET) substrate or a poly carbonate (PC) substrate can be applied to a flexible display.

The first electrode layer 15 is disposed on the substrate 14. The first electrode layer 15 is, for example, a strip-like metal cathode. The first electrode layer 15 can be regarded as a reflective layer, so that the light emitted by the organic layer stack 16 can go out through the protection unit 11. The material of the first electrode layer 15 is, for example, aluminum, calcium or magnesium silver alloy.

The organic layer stack 16 is disposed on the first electrode layer 15. The organic layer stack 16 is used to emit light and can include, for example, a hole injection layer, a hole transporting layer, an organic electroluminescent layer, an electron transporting layer, an electron injection layer or a combination thereof. Since the conventional art can be applied thereto, the related description is omitted here for conciseness. In one embodiment, the material of the organic layer stack 16 can include HIL1.3N, NPB (4,4'-bis[N-(1-naphthyl)-N-phenylamino]biphenyl), ALQ (tris(8-quinolinolato)aluminum), LiF, Al for example.

The second electrode layer 17 is disposed on the organic layer stack 16. The second electrode layer 17 can be made of transparent conducting material, such as indium tin oxide (ITO) or other metal oxides. The light emitted by the organic layer stack 16 can go out through the second electrode layer 17. Of course, in other embodiments, the materials of the first electrode layer 15 and the second electrode layer 17 can be selected such that the light emitted by the organic layer stack 16 can go out through the substrate 14 or through both of the substrate 14 and the protection unit 11.

The first electrode layer 15, the organic layer stack 16 and the second electrode layer 17 are disposed within the space formed by the protection unit 11 and the substrate 14.

The structure of the above-mentioned organic electroluminescent touch panel 1 is just for example but not for limiting the scope of the invention. In other embodiments, the organic electroluminescent touch panel 1 can further include other layers, such as a passivation layer, a planarization layer or an adhesive layer. Herein, an adhesive layer 18 is taken as an example and disposed between the protection unit 11 and the substrate 14.

In one embodiment, the second electrode layer 17 is a nanometal electrode layer. The nanometal electrode layer includes, for example, nanometal structure and medium. The nanometal structure is disposed in the medium. The nanometal structure is, for example, nanoparticles or nanowires, and the material thereof can be silver nanowires, nano magnesium silver alloy or nano copper. The nanoparticles are conducting nanoparticles for example, and the material thereof includes ITO, IGZO (indium gallium zinc oxide), IZO (indium zinc oxide), AZO (aluminum doped zinc oxide), GZO (gallium doped zinc oxide), CNT (carbon nanotube) or graphene. The nanometal electrode layer, the first anti-interference spot 13 and/or the touch-sensing unit 12 can be made of the composite material formed by adding the conducting nanoparticles into the metal nanowires. The nanometal electrode layer is formed by printing, inkjet printing, screen printing, coating, laser or photolithography process for example.

The following is an embodiment of the manufacturing method of the silver nanowires. First, the silver nanowire solution (Seashell Technology, AgNW-115) is spun for 60 seconds at a rate of 1000 r/min on a PET substrate to form a random distributed silver nanowire network, and the ITO nanoparticle solution is spun for 30 seconds at a rate of 2000 r/min on the silver nanowire network, and then the thermal annealing at about 100° C. is implemented to remove the solvent. The silver nanowire solution is diluted to the concentration of 1 mg/mL. The silver nanowire has the diameter of about 115 nm and the length of about 30 μm. The silver nanowire network with different sheet resistances and transmittances can be obtained by the repeated spin coating processes. The ITO nanoparticle solution is prepared by mixing the 30 wt. % ITO nanoparticles distributed in the isopropyl alcohol and the 2.5 wt. % polyvinyl alcohol (PVA) dissolved in the deionized water with the same volume as the isopropyl alcohol. By adding the distribution of the ITO nanoparticles into the PVA solution, the mechanical connection of the produced silver nanowire/ITO nanoparticle film can be enhanced.

Figure 2:
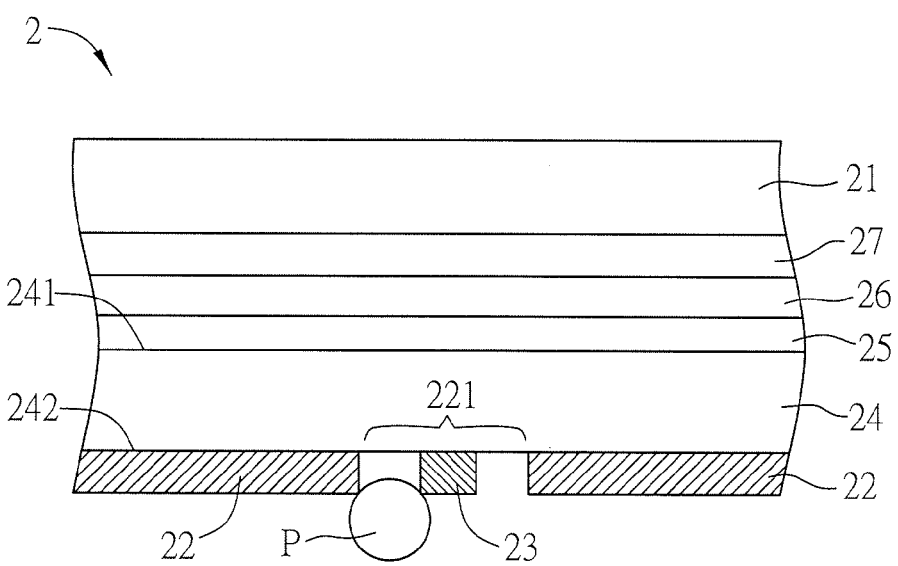
FIG. 2 is a schematic diagram of an organic electroluminescent touch panel of the second embodiment of the invention.

FIG. 2 is a schematic diagram of an organic electroluminescent touch panel 2 of the second embodiment of the invention. As shown in FIG. 2, the organic electroluminescent touch panel 2 includes a protection unit 21, a plurality of touch-sensing units 22, at least one first anti-interference spot 23, a substrate 24, a first electrode layer 25, an organic layer stack 26 and a second electrode layer 27.

The organic electroluminescent touch panel 2 is similar to the above embodiment. The main difference between them is that the substrate 24 includes a first surface 241 and a second surface 242 disposed opposite the first surface 241, the first surface 241 of the substrate 24 is disposed corresponding to the protection unit 21. Besides, the first electrode layer 25 is disposed on the first surface 241, the organic layer stack 26 is disposed on the first electrode layer 25, and the second electrode layer 27 is disposed on the organic layer stack 26. In addition, the first electrode layer 25, the organic layer stack 26 and the second electrode layer 27 are disposed in the space formed by the protection unit 21 and the substrate 24. Moreover, the touch-sensing units 22 are coplanarly disposed on the second surface 242 of the substrate 24, a first interval region 221 is formed between the adjacent touch-sensing units 22, and at least one first anti-interference spot 23 is disposed in the first interval region 221. In this embodiment, because the light emitted by the organic layer stack 26 doesn't pass through the touch-sensing unit 22 and the first anti-interference spot 23, the light will not be influenced thereby.

In one embodiment, the second electrode layer 27 is a nanometal electrode layer. Herein, the description of the second electrode layer 27 can refer to the description of the second electrode 17, so the related description is omitted here for conciseness.

Figure 3:
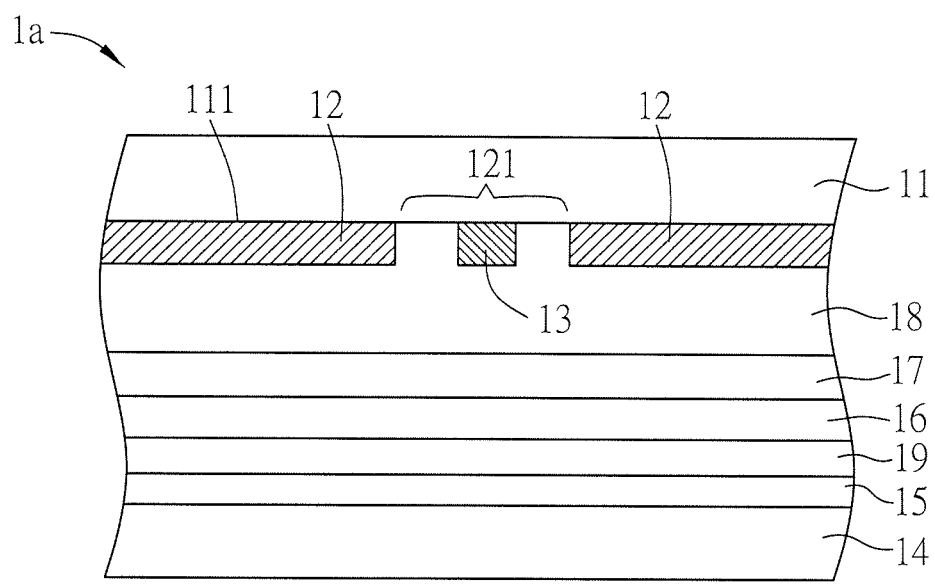
FIG. 3 is a schematic diagram of the organic electroluminescent touch panel as a variation of the first embodiment of the invention.

FIG. 3 is a schematic diagram of the organic electroluminescent touch panel 1a as a variation of the first embodiment of the invention. As shown in FIG. 3, the main difference between the organic electroluminescent touch panels 1 and 1a is that the organic electroluminescent touch panel 1a further includes a light absorbing layer 19, which is disposed between the organic layer stack 16 and the first electrode layer 15. The light absorbing layer 19 is an organic material layer doped with metal material for example. The material of the organic material layer is, for example, Triazole Oxadiazole (OXD), Triazine or the derivatives of Triazine. The above-mentioned metal material is, for example, alkali metals (e.g. Cs), alkaline earth metals or transition metals of the work function less than or equal to 4.2 eV, and the doping concentration of the metal is between 20% and 80% for example. The light absorbing layer 19 has optical interference effect. The optical destructive interference effect thereof can reduce the reflected amount of the external light, and the contrast of the display panel can be effectively enhanced thereby.

Figure 4:
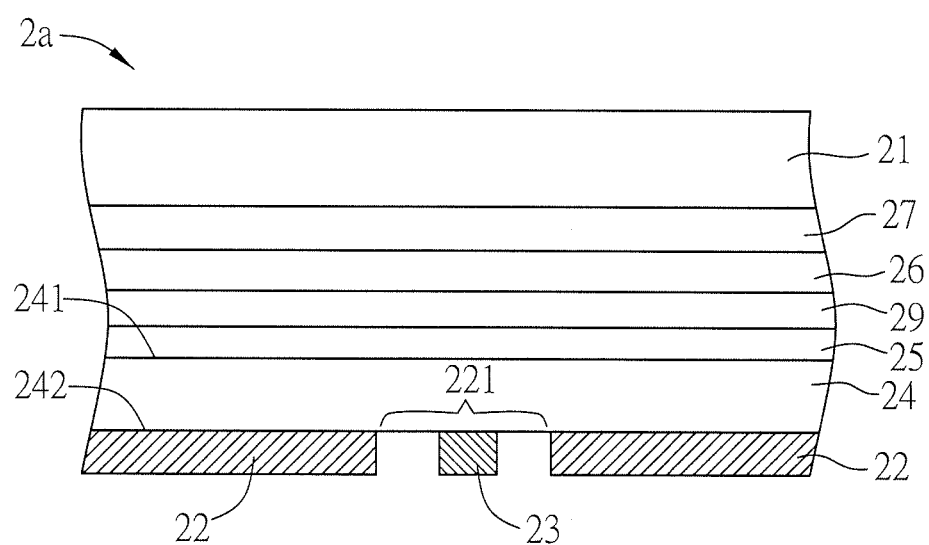
FIG. 4 is a schematic diagram of the organic electroluminescent touch panel as a variation of the second embodiment of the invention.

FIG. 4 is a schematic diagram of the organic electroluminescent touch panel 2a as a variation of the second embodiment of the invention. As shown in FIG. 4, the main difference between the organic electroluminescent touch panels 2 and 2a is that the organic electroluminescent touch panel 2a further includes a light absorbing layer 29, which is disposed between the organic layer stack 26 and the first electrode layer 25. Herein, the description of the light absorbing layer 29 can refer to the above description of the light absorbing layer 19, so the related description is omitted here for conciseness.

Figure 5:
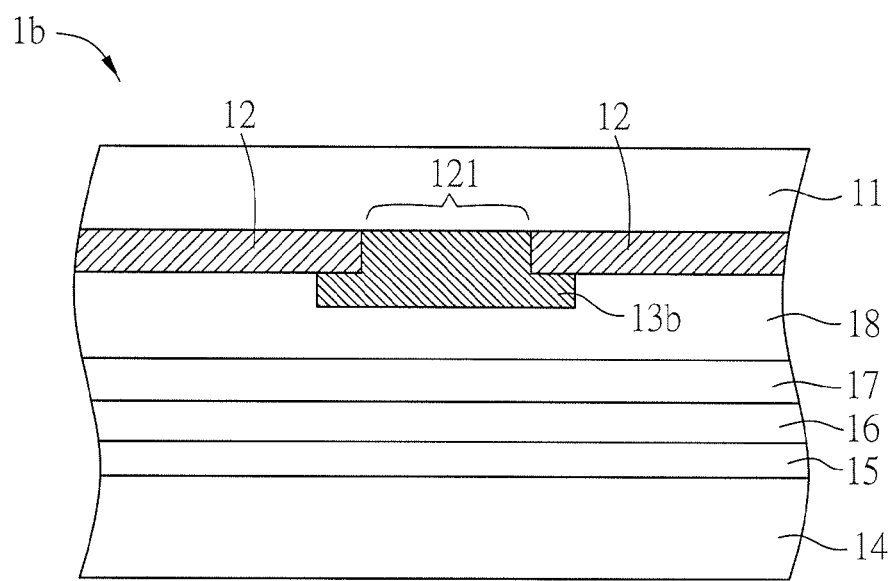
FIG. 5 is a schematic diagram of the organic electroluminescent touch panel as another variation of the first embodiment of the invention.

FIG. 5 is a schematic diagram of an organic electroluminescent touch panel 1b as a variation of the first embodiment of the invention. As shown in FIG. 5, the main difference between the organic electroluminescent touch panels 1 and 1b is that the first anti-interference spot 13b of the organic electroluminescent touch panel 1b not only is disposed in the first interval region 121 but also covers at least a part of the touch-sensing units 12, and is filled into the first interval region 121. Herein, the first anti-interference spot 13b is made of insulating material such that the touch-sensing units 12 won't be short-circuited. The first anti-interference spot 13b can be made of transparent material so as to be pervious to the light.

Figure 6:
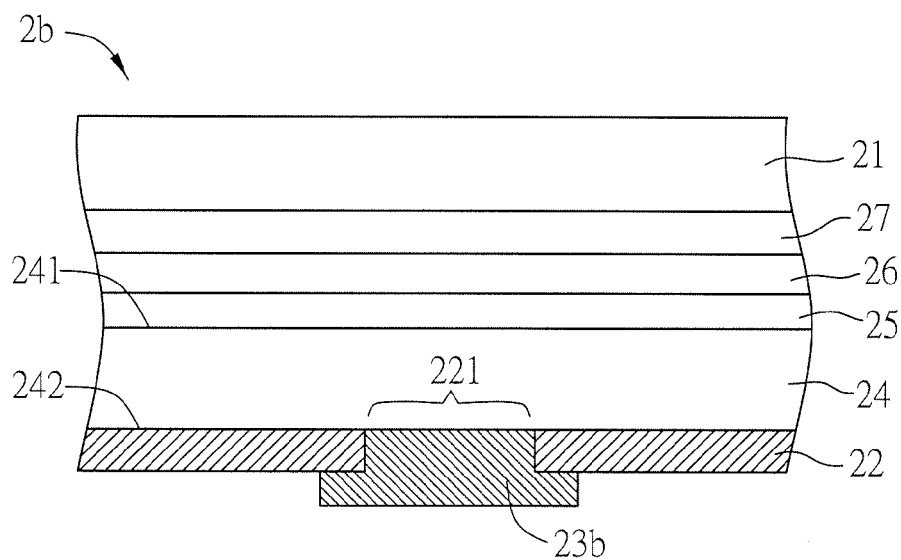
FIG. 6 is a schematic diagram of the organic electroluminescent touch panel as another variation of the second embodiment of the invention.

FIG. 6 is a schematic diagram of an organic electroluminescent touch panel 2b as a variation of the second embodiment of the invention. As shown in FIG. 6, the main difference between the organic electroluminescent touch panels 2 and 2b is that the first anti-interference spot 23b of the organic electroluminescent touch panel 2b not only is disposed in the first interval region 221 but also covers at least a part of the touch-sensing units 22, and is filled into the first interval region 221. Herein, the first anti-interference spot 23b is made of insulating material such that the touch-sensing units 22 won't be short-circuited. The first anti-interference spot 23b can be made of transparent material so as to be pervious to the light.

Figure 7:
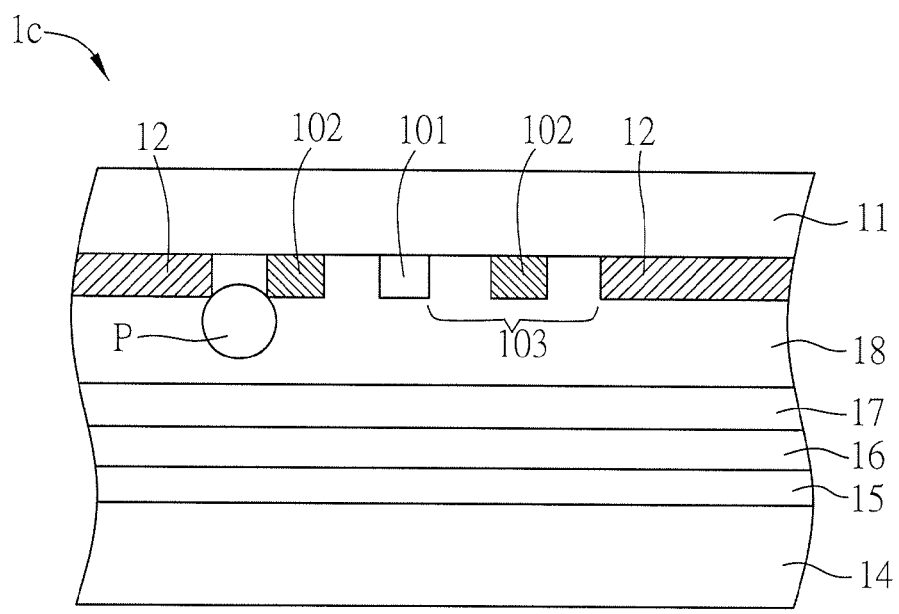
FIG. 7 is a schematic diagram of the organic electroluminescent touch panel as another variation of the first embodiment of the invention.

FIG. 7 is a schematic diagram of an organic electroluminescent touch panel 1c as a variation of the first embodiment of the invention. As shown in FIG. 7, the main difference between the organic electroluminescent touch panels 1 and 1c is that the organic electroluminescent touch panel 1c further includes a grounding unit 101 and at least a second anti-interference spot 102. The grounding unit 101 is disposed coplanarly with the touch-sensing units 12, and the grounding unit 101 and the adjacent touch-sensing unit 12 have a second interval region 103 therebetween. Besides, the second anti-interference spot 102 is disposed within the second interval region 103. Likewise, in practice, the second anti-interference spot 102 and the touch-sensing units 12 can be made in the same processing step and made of the same material to reduce the processing steps. However, this invention is not limited thereto. Herein, the second anti-interference spot 102 is made of conducting material and is electrically floating. By disposing the second anti-interference spot 102 within the second interval region 103, the interval between the touch-sensing unit 12 and the grounding unit 101 (second interval region 103) can be enlarged. Therefore, even if the particles P fall down or the scratch occurs, the touch-sensing unit 12 and the adjacent grounding unit 101 won't be short-circuited, so as to prevent the malfunction of the touch product and enhance the product yield. Besides, the enlarged spacing between the touch-sensing unit 12 and the grounding unit 101 may make the human eyes perceive their existence, but because the second anti-interference spot 102 is disposed between the touch-sensing unit 12 and the adjacent grounding unit 101, the human eyes will not easily perceive their existence so that the display performance won't be degraded. For example, the width of the second anti-interference spot 102 is between 50 μm and 70 μm, and the width of the second interval region 103 is between 70 μm and 130 μm.

Figure 8:
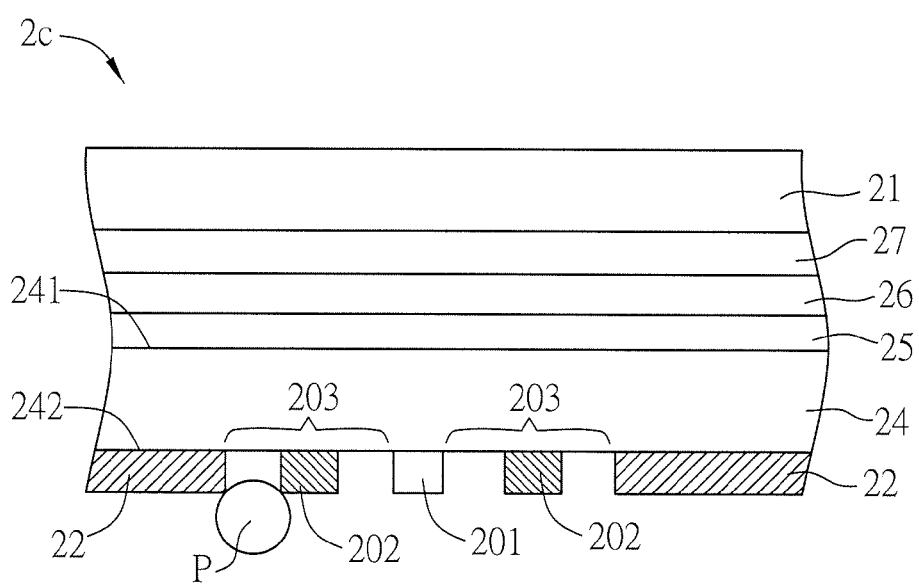
FIG. 8 is a schematic diagram of the organic electroluminescent touch panel as another variation of the second embodiment of the invention.

FIG. 8 is a schematic diagram of an organic electroluminescent touch panel 2c as a variation of the second embodiment of the invention. As shown in FIG. 8, the main difference between the organic electroluminescent touch panels 2 and 2c is that the organic electroluminescent touch panel 2c further includes a grounding unit 201 and at least a second anti-interference spot 202. The grounding unit 201 is disposed coplanarly with the touch-sensing units 22, and the grounding unit 201 and the adjacent touch-sensing unit 22 have a second interval region 203 therebetween. Besides, the second anti-interference spot 202 is disposed within the second interval region 203. Herein, the material and the forming method of the touch-sensing units 22 and the second anti-interference spot 202 can refer to the above description of the touch-sensing units 12 and the second anti-interference spot 102, so the related description is omitted here for conciseness.

Figure 9:
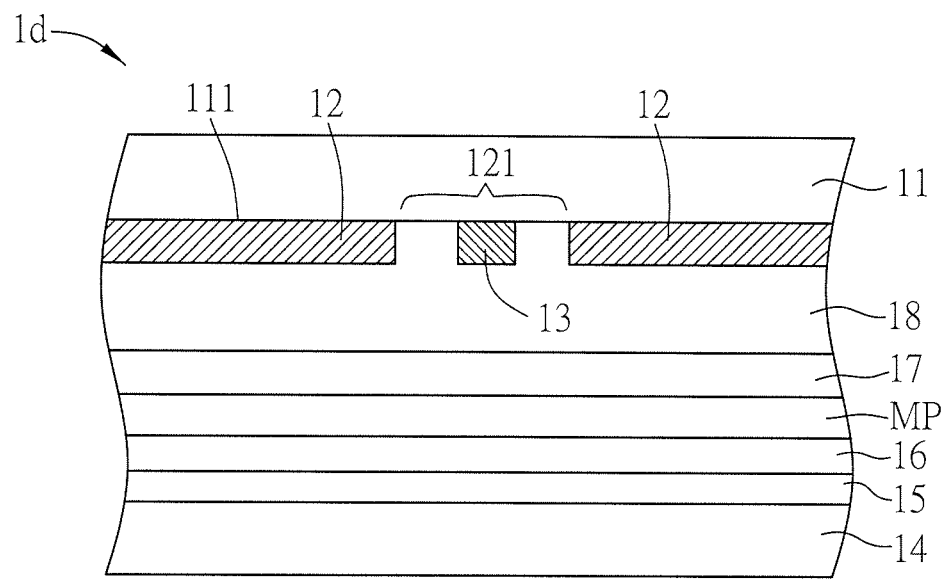
FIG. 9 is a schematic diagram of the organic electroluminescent touch panel as another variation of the first embodiment of the invention.

FIG. 9 is a schematic diagram of an organic electroluminescent touch panel 1d as a variation of the first embodiment of the invention. As shown in FIG. 9, the main difference between the organic electroluminescent touch panels 1 and 1d is that the organic electroluminescent touch panel 1d further includes a surface modification layer MP, which is disposed between the second electrode layer 17 and the organic layer stack 16. The surface modification layer MP can provide the effect of surface modification and/or planarization for example. The surface modification layer MP can make the connection between the second electrode layer 17 and the organic layer stack 16 exhibit a better performance. Therefore, the surface modification layer MP can enhance the hole injection efficiency of the second electrode layer 17 and extend the element's lifespan. The surface modification layer MP can act as a hole injection layer and has a larger thickness than the conventional hole injection layer so as to reduce the influence of the surface roughness of the second electrode layer 17. The material of the surface modification layer MP includes, for example, copper phthalocyanine (CuPc) or 4,4'-bis[N-(1-naphthyl)-N-phenylamino]biphenyl (NPB).

Figure 10:
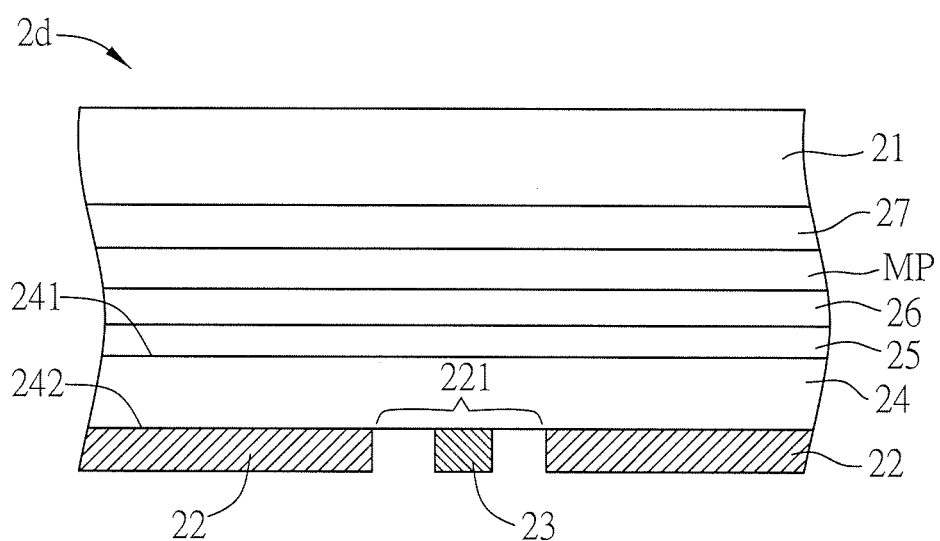
FIG. 10 is a schematic diagram of the organic electroluminescent touch panel as another variation of the second embodiment of the invention.

FIG. 10 is a schematic diagram of an organic electroluminescent touch panel 2d as a variation of the second embodiment of the invention. As shown in FIG. 10, the main difference between the organic electroluminescent touch panels 2 and 2d is that the organic electroluminescent touch panel 2d further includes a surface modification layer MP, which is disposed between the second electrode layer 27 and the organic layer stack 26. Herein, the description of the surface modification layer MP can refer to the above description of the surface modification layer MP, the related description is omitted here for conciseness.

In other embodiments, the second electrode layer can be subjected to a surface treatment to obtain the effect of surface modification and/or planarization. Of course, the surface modification layer MP and the surface treatment of the second electrode layer can be implemented separately, or in combination.

To be noted, the technical features as mentioned above can be implemented separately or in combination.

In a top view, the shapes of the touch-sensing unit, first anti-interference spot, grounding unit and second anti-interference spot are not limited, which can be, for example, a curved shape, a triangle, a quadrangle (such as a rhombus), another polygon or a combination thereof. Herein, some examples are illustrated in FIGS. 11A to 11C.

Figure 11A:
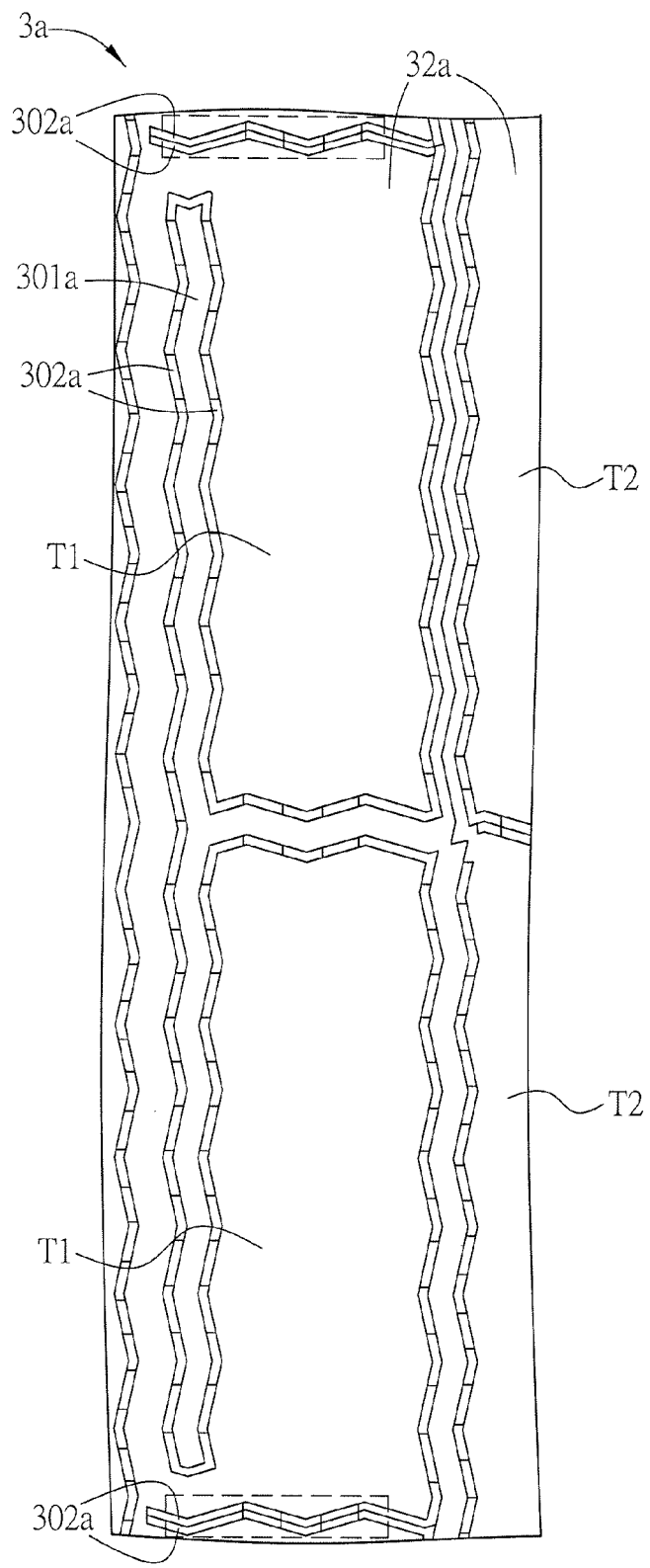
FIGS. 11A to 11C are schematic top views of the organic electroluminescent touch panels of different embodiments of the invention.
Figure 11B:
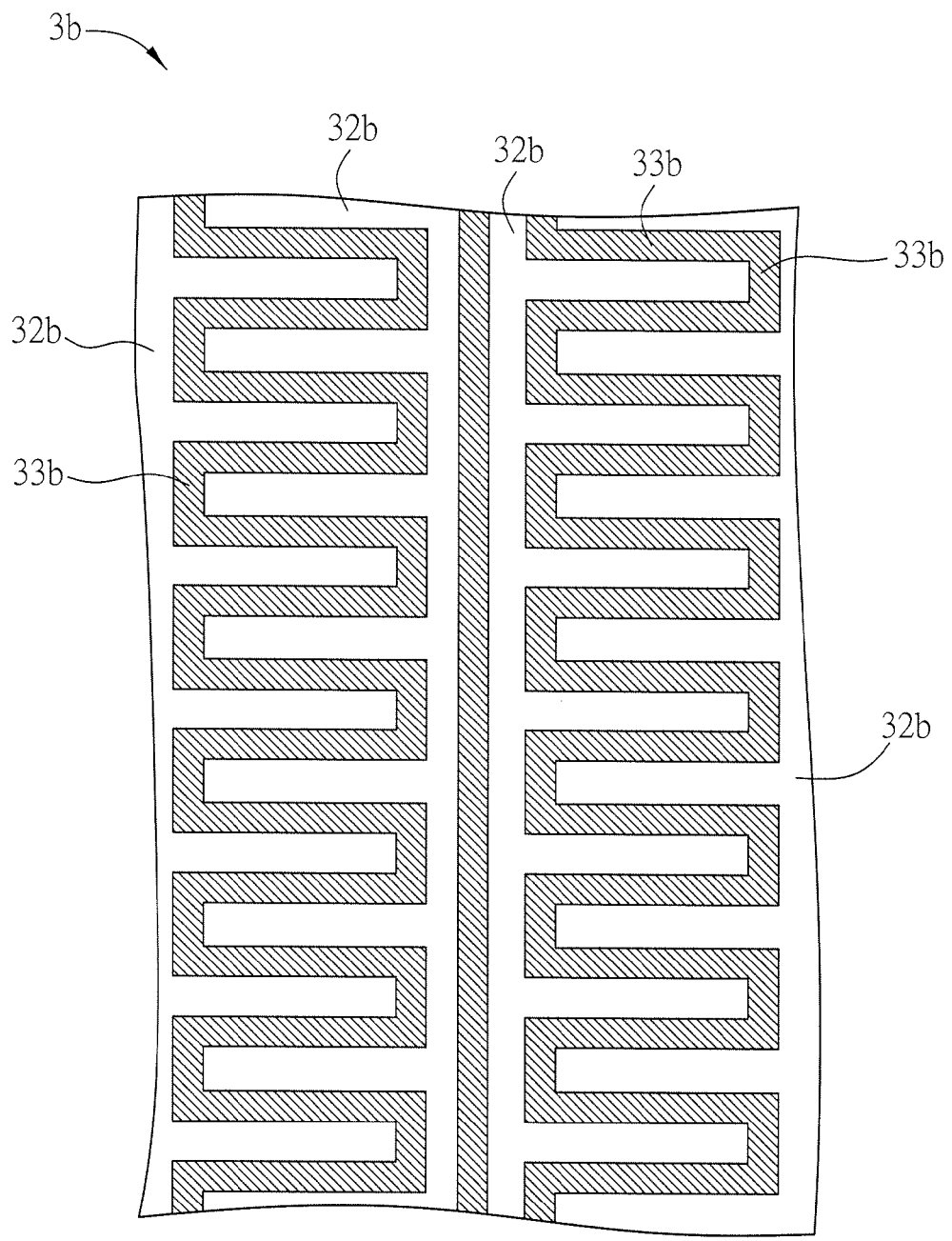
Figure 11C:
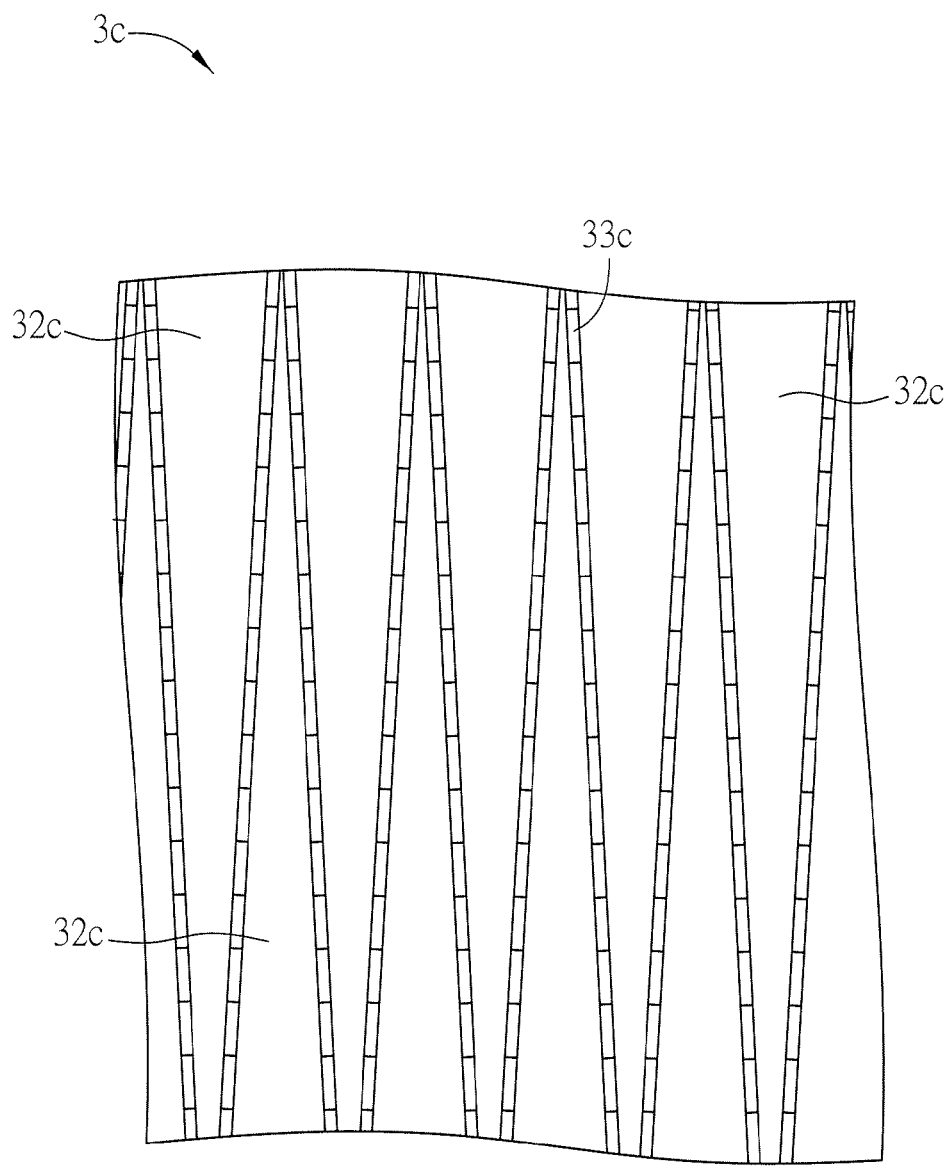

FIG. 11A is a schematic top view of an organic electroluminescent touch panel 3a of an embodiment of the invention. For the convenient illustration, FIG. 11A just shows the touch-sensing unit 32a, the second anti-interference spot 302a and the grounding unit 301a. The touch-sensing unit 32a has a quadrangle-like shape. The grounding unit 301a is disposed around the touch-sensing unit 32a and, for example, between the adjacent touch-sensing units 32a. Moreover, the anti-interference spot (second anti-interference spot 302a for example) is disposed within the second interval region formed by the grounding unit 301a and the touch-sensing unit 32a. Herein, the second anti-interference spot 302a is disposed on at least one side of the touch-sensing unit 32a or around the whole touch-sensing unit 32a.

Moreover, in this embodiment, the first anti-interference spots or the second anti-interference spots can be disposed adjacent to each other. For example, the dotted block in FIG. 11A shows two second anti-interference spots 302a disposed adjacent to each other. Therefore, the width of the two adjacent second anti-interference spots 302a can be between 100 μm and 140 μm, and the width of the second interval region can be between 120 μm and 200 μm. The same disposition also can be applied to the first anti-interference spot, and the related description is omitted here for conciseness.

Furthermore, the touch-sensing units 32a can include a plurality of first touch-sensing elements T1 and a plurality of second touch-sensing elements T2. The first touch-sensing elements T1 serve as the transmitters and the second touch-sensing elements T2 serve as the receivers. The transmitters are coupled with an excitation signal (not shown). When the user touches, the capacitance between the first touch-sensing element T1 and the second touch-sensing element T2 is changed so that the touch coordinates can be obtained.

In other embodiments, the touch-sensing units 32 can include a plurality of first touch-sensing elements electrically connected with each other along a first direction and a plurality of second touch-sensing elements electrically connected with each other along a second direction. For example, the first direction is X direction and the second direction is Y direction. Thereby, the touch coordinates of the user can be obtained after the signal process. Since the conventional art can be applied thereto, the related description is omitted here for conciseness.

FIG. 11B is a schematic top view of an organic electroluminescent touch panel 3b of an embodiment of the invention. For the convenient illustration, FIG. 11B just shows the touch-sensing unit 32b and the first anti-interference spot 33b. The touch-sensing unit 32b has a bent shape. Moreover, the anti-interference spot (first anti-interference spot 33b for example) is disposed within the first interval region formed by the adjacent touch-sensing units 32b. Herein, the first anti-interference spot 33b exhibits a zigzag pattern and is disposed on at least one side of the touch-sensing unit 32b or around the whole touch-sensing unit 32b.

FIG. 11C is a schematic top view of an organic electroluminescent touch panel 3c of an embodiment of the invention. For the convenient illustration, FIG. 11C just shows the touch-sensing unit 32c and the first anti-interference spot 33c. The touch-sensing unit 32c has a triangular shape and the touch-sensing units 32c are disposed side by side. Moreover, the anti-interference spot (first anti-interference spot 33c for example) is disposed within the first interval region formed by the adjacent touch-sensing units 32c. Herein, the first anti-interference spot 33c has a strip-like shape and is disposed on at least one side of the touch-sensing unit 32c or around the whole touch-sensing unit 32c.

Summarily, in the organic electroluminescent touch panel of this invention, the first anti-interference spot is disposed in the first interval region formed by the adjacent touch-sensing units, and the interval between the touch-sensing units is enlarged thereby, for example, to 70 μm~130 μm from the original 10 μm~30 μm. Hence, even if the particles fall down or the scratch occurs during the process, the adjacent touch-sensing units won't be short-circuited. Therefore, the first anti-interference spots provide the electrical anti-interference effect, so as to prevent the malfunction of the touch product and enhance the product yield and flexibility.

Furthermore, the enlarged spacing between the touch-sensing units may make the human eyes perceive the existence of the touch-sensing units, but because the first anti-interference spot with a zigzag pattern is disposed between the adjacent touch-sensing units, the touch-sensing units will become invisible and the human eyes will not easily perceive their existence, so as to provide the optical anti-interference effect and enhance the display performance.

In addition, some kind of the flexible transparent conductor that can be processed in the thermal and chemical well condition and under a non-vacuum environment is urgently demanded to effectively replace the ITO thin film sputtering process, so as to lower down the production cost and benefit the application of the rising flexible electronic industry. This invention can achieve the above-mentioned purpose by using the composite material that is faulted by adding conducting nanoparticles into metal nanowires to form the nanometal electrode layer, the first anti-interference spot and/or the touch-sensing unit.

Moreover, this invention uses the nanometal electrode layer to replace the original ITO. In comparison with the vacuum coating process of ITO, the wet process of the nanometal electrode layer can greatly reduce the cost and enhance the production efficiency, and the nanometal electrode layer has a better conductivity than ITO. Therefore, the light emitting efficiency of the organic layer stack can be increased.

Moreover, by using the nanomaterial, this invention has advantages such as low wire junction resistance, smooth surface, well mechanical connection and flexibility, high transmittance and low sheet resistance. Besides, the addition of the conducting nanoparticles can help the enhancement of the optical coupling efficiency and the increment of the optical scattering level, so as to increase the viewing angle of the display panel and enhance the display performance.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An organic electroluminescent touch panel, comprising:
    a protection unit;
    a plurality of touch-sensing units coplanarly disposed on the protection unit, wherein a first interval region is formed between the adjacent touch-sensing units;
    at least one first anti-interference spot disposed in the first interval region, wherein a width of the first anti-interference spot is between 50 μm and 70 μm, and a width of the first interval region is between 70 μm and 130 μm;
    a substrate disposed corresponding to the protection unit;
    a first electrode layer disposed on the substrate;
    an organic layer stack disposed on the first electrode layer; and
    a second electrode layer disposed on the organic layer stack, wherein the first electrode layer, the organic layer stack and the second electrode layer are disposed in the space formed by the protection unit and the substrate.

2. The organic electroluminescent touch panel as recited in claim 1, wherein the first anti-interference spot exhibits a zigzag pattern.

3. The organic electroluminescent touch panel as recited in claim 1, further comprising:
    a grounding unit disposed coplanarly with the touch-sensing units, wherein the grounding unit and the adjacent touch sensing unit have a second interval region therebetween; and
    at least one second anti-interference spot disposed in the second interval region.

4. The organic electroluminescent touch panel as recited in claim 1, wherein by the first anti-interference spot disposed within the first interval region formed by the adjacent touch-sensing units, the interval between the adjacent touch sensing units is enlarged, the short circuit is prevented even if the particle pollution is caused during the subsequent process, so as to provide the electrical anti-interference effect.

5. The organic electroluminescent touch panel as recited in claim 1, wherein the substrate is a flexible substrate or a rigid substrate.

6. The organic electroluminescent touch panel as recited in claim 1, further comprising:
    a light absorbing layer disposed between the organic layer stack and the first electrode layer.

7. The organic electroluminescent touch panel as recited in claim 1, wherein the protection unit at least comprises a cover plate, a single layer membrane, a multilayer membrane or a combination thereof.

8. The organic electroluminescent touch panel as recited in claim 1, wherein the organic layer stack at least comprises a hole injection layer, a hole transporting layer, a light emitting layer, an electron transporting layer, an electron injection layer or a combination thereof.

9. The organic electroluminescent touch panel as recited in claim 1, wherein the second electrode layer is a nanometal electrode layer.

10. The organic electroluminescent touch panel as recited in claim 9, wherein the nanometal electrode layer, the first anti-interference spot and/or the touch-sensing unit are made of the composite material formed by adding conducting nanoparticles into metal nanowires.

11. The organic electroluminescent touch panel as recited in claim 9, wherein the nanometal electrode layer is formed by printing, inkjet printing, screen printing, coating, laser or photolithography process.

12. The organic electroluminescent touch panel as recited in claim 1, further comprising:
    a surface modification layer disposed between the second electrode layer and the organic layer stack.

13. The organic electroluminescent touch panel as recited in claim 1, wherein the shapes of the touch-sensing unit and/or the first anti-interference spot are a curved shape, a triangle, a quadrangle, a polygon or a combination thereof.

14. An organic electroluminescent touch panel, comprising:
    a protection unit;
    a substrate comprising a first surface and a second surface disposed opposite the first surface, wherein the first surface of the substrate is disposed corresponding to the protection unit;
    a first electrode layer disposed on the first surface;
    an organic layer stack disposed on the first electrode layer;
    a second electrode layer disposed on the organic layer stack, wherein the first electrode layer, the organic layer stack and the second electrode layer are disposed in the space formed by the protection unit and the substrate;
    a plurality of touch-sensing units coplanarly disposed on the second surface of the substrate, wherein a first interval region is formed between the adjacent touch-sensing units; and
    at least one first anti-interference spot disposed in the first interval region, wherein a width of the first anti-interference spot is between 50 μm and 70 μm, and a width of the first interval region is between 70 μm and 130 μm.

15. The organic electroluminescent touch panel as recited in claim 14, wherein the first anti-interference spot exhibits a zigzag pattern.

16. The organic electroluminescent touch panel as recited in claim 14, further comprising:
   a grounding unit disposed coplanarly with the touch-sensing units, wherein the grounding unit and the adjacent touch sensing unit have a second interval region therebetween; and
   at least one second anti-interference spot disposed in the second interval region.

17. The organic electroluminescent touch panel as recited in claim 14, wherein by the first anti-interference spot disposed within the first interval region formed by the adjacent touch-sensing units, the interval between the adjacent touch sensing units is enlarged, the short circuit is prevented even if the particle pollution is caused during the subsequent process, so as to provide the electrical anti-interference effect.

18. The organic electroluminescent touch panel as recited in claim 14, further comprising:
   a light absorbing layer disposed between the organic layer stack and the first electrode layer.

19. The organic electroluminescent touch panel as recited in claim 14, wherein the second electrode layer is a nano-metal electrode layer.

* * * * *